United States Patent
Jia et al.

(10) Patent No.: US 11,416,033 B2
(45) Date of Patent: Aug. 16, 2022

(54) FOLDABLE DISPLAY DEVICE FOR IMPROVING THE FLATNESS OF A BENDING REGION

(71) Applicant: WUHAN CHINA STAR OPTOELECTRONICS SEMICONDUCTOR DISPLAY TECHNOLOGY CO., LTD., Wuhan (CN)

(72) Inventors: Yongzhen Jia, Wuhan (CN); Shanghung Yeh, Wuhan (CN)

( * ) Notice: Subject to any disclaimer, the term of this patent is extended or adjusted under 35 U.S.C. 154(b) by 299 days.

(21) Appl. No.: 16/630,865

(22) PCT Filed: Nov. 5, 2019

(86) PCT No.: PCT/CN2019/115672
§ 371 (c)(1),
(2) Date: Jan. 14, 2020

(87) PCT Pub. No.: WO2021/017247
PCT Pub. Date: Feb. 4, 2021

(65) Prior Publication Data
US 2021/0360799 A1    Nov. 18, 2021

(30) Foreign Application Priority Data
Jul. 30, 2019 (CN) .......................... 201910692425.6

(51) Int. Cl.
*G06F 1/16* (2006.01)
*H05K 5/00* (2006.01)
(Continued)

(52) U.S. Cl.
CPC ............ *G06F 1/1652* (2013.01); *G09F 9/301* (2013.01); *H04M 1/0268* (2013.01);
(Continued)

(58) Field of Classification Search
CPC .... G06F 1/1652; H04M 1/0268; G09F 9/301; H05K 5/0013; H05K 5/0017; H05K 5/0217
See application file for complete search history.

(56) References Cited

U.S. PATENT DOCUMENTS 9,075,258 B2 * 7/2015 Watanabe ............. G06F 1/1616
9,204,565 B1 * 12/2015 Lee ........................ E05F 1/1016
(Continued)

FOREIGN PATENT DOCUMENTS

CN    103034293 A    4/2013
CN    208353382 U    1/2019
(Continued)

*Primary Examiner* — Rockshana D Chowdhury
*Assistant Examiner* — Douglas R Burtner

(57) ABSTRACT

A foldable display device is provided, which includes a first middle frame and a second middle frame for supporting a flexible display panel. A first surface of a first planar support member of the first middle frame that faces the display panel extends toward a second planar support member, and a second surface of the second planar support member of the second middle frame that faces the display panel extends toward the first planar support member. Accordingly, the distance between the first surface of the first planar support member and the second surface of the second planar support member is reduced. Therefore, when the display panel expands, the bending region of the display panel can be effectively supported by the first planar support member and the second planar support member. In this way, the bending region can have better flatness when the display panel expands.

17 Claims, 3 Drawing Sheets

(51) Int. Cl.
*H05K 5/02* (2006.01)
*H04M 1/02* (2006.01)
*G09F 9/30* (2006.01)

(52) U.S. Cl.
CPC ......... *H05K 5/0013* (2013.01); *H05K 5/0017* (2013.01); *H05K 5/0217* (2013.01)

(56) References Cited

U.S. PATENT DOCUMENTS

| | | | | |
|---|---|---|---|---|
| 9,348,450 | B1* | 5/2016 | Kim | G06F 1/1616 |
| 9,798,359 | B2* | 10/2017 | Seo | G06F 1/1681 |
| 10,306,783 | B2* | 5/2019 | Seo | E05D 1/04 |
| 10,356,922 | B2* | 7/2019 | Chen | H05K 5/0017 |
| 10,420,233 | B2* | 9/2019 | Lee | H04M 1/0268 |
| 10,447,829 | B2* | 10/2019 | Lin | H04M 1/0216 |
| 10,585,457 | B2* | 3/2020 | Park | G06F 1/1652 |
| 10,847,735 | B2* | 11/2020 | Seo | G09F 13/24 |
| 10,963,012 | B2* | 3/2021 | Shin | G06F 3/0412 |
| 11,023,009 | B2* | 6/2021 | Kim | G06F 1/1641 |
| 11,048,305 | B1* | 6/2021 | Ye | G06F 1/1616 |
| 11,175,693 | B2* | 11/2021 | Song | G09G 3/3208 |
| 11,175,696 | B2* | 11/2021 | Cho | G06F 1/1641 |
| 2012/0243206 | A1* | 9/2012 | Wang | G09F 9/30 362/97.1 |
| 2012/0243207 | A1* | 9/2012 | Wang | G09F 9/301 362/97.1 |
| 2012/0262870 | A1* | 10/2012 | Leung | G06F 1/1626 361/679.27 |
| 2015/0233162 | A1 | 8/2015 | Lee et al. | |
| 2015/0366089 | A1* | 12/2015 | Park | H04M 1/022 361/679.01 |
| 2016/0109908 | A1* | 4/2016 | Siddiqui | G06F 1/1652 16/225 |
| 2016/0143162 | A1 | 5/2016 | Van Dijk et al. | |
| 2016/0302316 | A1* | 10/2016 | Jeong | H05K 5/0226 |
| 2016/0366772 | A1* | 12/2016 | Choi | G06F 1/1616 |
| 2018/0070460 | A1* | 3/2018 | Han | G06F 1/1626 |
| 2019/0274228 | A1* | 9/2019 | You | E05F 1/12 |
| 2020/0103941 | A1* | 4/2020 | Lin | G06F 1/1641 |
| 2020/0209918 | A1* | 7/2020 | Yoon | G06F 1/1681 |
| 2020/0387195 | A1* | 12/2020 | Kim | G06F 1/1618 |
| 2020/0401193 | A1* | 12/2020 | Hsu | F16C 11/04 |
| 2021/0011514 | A1* | 1/2021 | Wang | G06F 1/1616 |
| 2021/0014347 | A1* | 1/2021 | Ma | G06F 1/1616 |
| 2021/0014989 | A1* | 1/2021 | Hsu | H05K 5/0226 |
| 2021/0191468 | A1* | 6/2021 | Nakamura | G06F 3/04164 |
| 2021/0191475 | A1* | 6/2021 | Park | G06F 1/1652 |
| 2021/0200277 | A1* | 7/2021 | Park | G06F 1/1618 |
| 2021/0219437 | A1* | 7/2021 | Kim | G06F 1/1624 |
| 2021/0240232 | A1* | 8/2021 | Cheng | G06F 1/1616 |
| 2021/0240294 | A1* | 8/2021 | Ko | G06F 3/0416 |
| 2022/0046813 | A1* | 2/2022 | Cheng | H04M 1/022 |
| 2022/0051594 | A1* | 2/2022 | Eguchi | H01L 27/3244 |
| 2022/0061174 | A1* | 2/2022 | Xie | H04M 1/0216 |

FOREIGN PATENT DOCUMENTS

| | | |
|---|---|---|
| CN | 109461383 A | 3/2019 |
| CN | 109637377 A | 4/2019 |

* cited by examiner

FOLDABLE DISPLAY DEVICE FOR IMPROVING THE FLATNESS OF A BENDING REGION

FIELD OF THE DISCLOSURE

The present application relates to display technologies, and more particularly to a foldable display device.

DESCRIPTION OF RELATED ARTS

Foldable mobile phones are directed to an important research hot zone for flexible electronic products in the future. For the foldable mobile phones, a currently-adopted structure is to arrange two rotating shafts of engaged gear wheel at edges of a screen. Such a structure is characterized by simplicity, robustness and endurance. Meanwhile, it will not bring extra pulling force to the screen. Currently, it is an important architecture for the foldable mobile phones. A primary problem of the existing foldable mobile phones is that independent middle frames are used at two sides of the screen and a gap is left between the middle frames. When the foldable mobile phone is used by a user in its flattened state, a feeling that a bending region of a display panel sinks apparently will be perceived and thus the experience of touch-type APPs is affected.

Technical Problems

The objective of the present application is to provide a foldable display device, for solving the problem of uneven flatness of the bending region in using existing display panels.

Technical Solutions

To achieve above objective, an aspect of the present application is to provide a foldable display device, including a bottom frame, a middle frame and a front frame that are configured to make the display device be in a folding state and an expanding state, the bottom frame configured to support the middle frame, the front frame configured to cover the middle frame, the display device including:

a display panel, disposed between the middle frame and the front frame, the display panel including a display region having a plurality of pixels and configured to display images, the display region divided into a first non-bending region, a second non-bending region and a bending region, the bending region located between the first non-bending region and the second non-bending region;

wherein the middle frame includes:

a first middle frame, slidably connected to the bottom frame, including a first planar support member which is adhered to the first non-bending region and overlaps with the bending region at a side of the bending region; and a second middle frame, slidably connected to the bottom frame, including a second planar support member which is adhered to the second non-bending region and overlaps with the bending region at the other side of the bending region, the display panel and a first face of the first planar support member located at a same side, the bottom frame and a second face of the first planar support member located at a same side, the display panel and a first face of the second planar support member located at a same side, the bottom frame and a second face of the second planar support member located as a same side, wherein a first end of the first planar support member is located away from the bending region, a second end of the first planar support member is closer to the second planar support member than the first end of the first planar support member, a first end of the second planar support member is located away from the bending region, a second end of the second planar support member is closer to the first planar support member than the first end of the second planar support member, wherein the first face of the first planar support member extends from a position corresponding to a lateral side of the second face of the first planar support member at the second end of the first planar support member to the first face of the second planar support member; the first face of the second planar support member extends from a position corresponding to a lateral side of the second face of the second planar support member at the second end of the second planar support member to the first face of the first planar support member.

In an embodiment of the present application, when the display panel expands, the first face of the first planar support member and the first face of the second planar support member are coplanar and the second face of the first planar support member and the second face of the second planar support member are coplanar.

In an embodiment of the present application, a first gap between the first face of the first planar support member and the first face of the second planar support member is less than a second gap between the second face of the first planar support member and the second face of the second planar support member.

In an embodiment of the present application, the first gap is less than or equal to 0.3 mm.

In an embodiment of the present application, the first planar support member has a first chamfer which extends from a lateral side of the second face of the first planar support member to a lateral side of the first face of the first planar support member along a direction toward the second planar support member; the second planar support member has a second chamfer which extends from a lateral side of the second face of the second planar support member to a lateral side of the first face of the second planar support member along a direction toward the first planar support member.

In an embodiment of the present application, the first middle frame includes a first lateral portion adjacent to the first planar support member, the first lateral portion is disposed at an end of the first planar support member different from the first end and the second end of the first planar support member; the second middle frame includes a second lateral portion adjacent to the second planar support member, the second lateral portion is disposed at an end of the second planar support member different from the first end and the second end of the second planar support member, the first lateral portion and the second lateral portion are located at a same side, wherein a surface of the first lateral portion of the first middle frame that faces the display panel is formed with a first curved face along a direction toward the second lateral portion and the bottom frame; a surface of the second lateral portion of the second middle frame that faces the display panel is formed with a second curved face along a direction toward the first lateral portion and the bottom frame.

In an embodiment of the present application, the display device further includes a pre-stress assembly, which includes:

a middle frame connecting member, connected to the middle frame, including an abutting member having an abutting face;

a bottom frame fastening member, fastened to the bottom frame, including an assembling member formed with a receiving slot; and an elastic member, disposed in the receiving slot of the assembling member of the bottom frame fastening member, the elastic member preset with an unbalanced elastic force, a wall of the receiving slot of the assembling member of the bottom frame fastening member and the abutting face of the abutting member of the middle frame connecting member provided with the elastic force at two ends of the elastic member, respectively, wherein when the middle frame rotates, the elastic member pushes the middle frame to make the middle frame move outward, avoiding interference with the middle frame during folding the display panel.

In an embodiment of the present application, the display device further includes an electric drive assembly, which includes:

a middle frame connecting member, connected to the middle frame, including a base and an intervening member fastened to the base, the intervening member having rack;

a motor; and a gear wheel, disposed along a rotating axis of the motor, the gear wheel on the motor engaging with the rack of the intervening member of the middle frame connecting member, wherein the motor is operated when the middle frame rotates, to generate a pushing force applied to the middle frame such that the middle frame moves outward, avoiding interference with the middle frame during folding the display panel.

In an embodiment of the present application, the display panel further includes:

a connecting frame, disposed at a position corresponding to the bending region of the display panel, the connecting frame pivotably connected to the bottom frame.

In another aspect, the present application provides a foldable display device, including a bottom frame, a middle frame and a front frame that are configured to make the display device be in a folding state and an expanding state, the bottom frame configured to support the middle frame, the front frame configured to cover the middle frame, the display device including:

a display panel, disposed between the middle frame and the front frame, the display panel including a display region having a plurality of pixels and configured to display images, the display region divided into a first non-bending region, a second non-bending region and a bending region, the bending region located between the first non-bending region and the second non-bending region;

wherein the middle frame includes:

a first middle frame, slidably connected to the bottom frame, including a first planar support member which is adhered to the first non-bending region and overlaps with the bending region at a side of the bending region; and a second middle frame, slidably connected to the bottom frame, including a second planar support member which is adhered to the second non-bending region and overlaps with the bending region at the other side of the bending region, the display panel and a first face of the first planar support member located at a same side, the bottom frame and a second face of the first planar support member located at a same side, the display panel and a first face of the second planar support member located at a same side, the bottom frame and a second face of the second planar support member located as a same side, wherein the first face of the first planar support member of the first middle frame and the first face of the second planar support member of the second middle frame are closely joined together and support the bending region of the display panel at the joint.

In an embodiment of the present application, a first end of the first planar support member is located away from the bending region, a second end of the first planar support member is closer to the second planar support member than the first end of the first planar support member, a first end of the second planar support member is located away from the bending region, a second end of the second planar support member is closer to the first planar support member than the first end of the second planar support member, wherein the first face of the first planar support member extends from a position corresponding to a lateral side of the second face of the first planar support member at the second end of the first planar support member to the first face of the second planar support member; the first face of the second planar support member extends from a position corresponding to a lateral side of the second face of the second planar support member at the second end of the second planar support member to the first face of the first planar support member.

In an embodiment of the present application, when the display panel expands, the first face of the first planar support member and the first face of the second planar support member are coplanar and the second face of the first planar support member and the second face of the second planar support member are coplanar.

In an embodiment of the present application, a first gap between the first face of the first planar support member and the first face of the second planar support member is less than a second gap between the second face of the first planar support member and the second face of the second planar support member.

In an embodiment of the present application, the first gap is less than or equal to 0.3 mm.

In an embodiment of the present application, the first planar support member has a first chamfer which extends from a lateral side of the second face of the first planar support member to a lateral side of the first face of the first planar support member along a direction toward the second planar support member; the second planar support member has a second chamfer which extends from a lateral side of the second face of the second planar support member to a lateral side of the first face of the second planar support member along a direction toward the first planar support member.

In an embodiment of the present application, the first middle frame includes a first lateral portion adjacent to the first planar support member, the first lateral portion is disposed at an end of the first planar support member different from the first end and the second end of the first planar support member; the second middle frame includes a second lateral portion adjacent to the second planar support member, the second lateral portion is disposed at an end of the second planar support member different from the first end and the second end of the second planar support member, the first lateral portion and the second lateral portion are located at a same side, wherein a surface of the first lateral portion of the first middle frame that faces the display panel is formed with a first curved face along a direction toward the second lateral portion and the bottom frame; a surface of the second lateral portion of the second middle frame that faces the display panel is formed with a second curved face along a direction toward the first lateral portion and the bottom frame.

In an embodiment of the present application, the display device further includes a pre-stress assembly, which includes:

a middle frame connecting member, connected to the middle frame, including an abutting member having an abutting face;

a bottom frame fastening member, fastened to the bottom frame, including an assembling member formed with a receiving slot; and an elastic member, disposed in the receiving slot of the assembling member of the bottom frame fastening member, the elastic member preset with an unbalanced elastic force, a wall of the receiving slot of the assembling member of the bottom frame fastening member and the abutting face of the abutting member of the middle frame connecting member provided with the elastic force at two ends of the elastic member, respectively, wherein when the middle frame rotates, the elastic member pushes the middle frame to make the middle frame move outward, avoiding interference with the middle frame during folding the display panel.

In an embodiment of the present application, the display device further includes an electric drive assembly, which includes:

a middle frame connecting member, connected to the middle frame, including a base and an intervening member fastened to the base, the intervening member having rack;

a motor; and a gear wheel, disposed along a rotating axis of the motor, the gear wheel on the motor engaging with the rack of the intervening member of the middle frame connecting member, wherein the motor is operated when the middle frame rotates, to generate a pushing force applied to the middle frame such that the middle frame moves outward, avoiding interference with the middle frame during folding the display panel.

In an embodiment of the present application, the display panel further includes:

a connecting frame, disposed at a position corresponding to the bending region of the display panel, the connecting frame pivotably connected to the bottom frame.

Beneficial Effects

In the present application, the surface of the first planar support member of the first middle frame that faces the display panel extends toward the second planar support member and the surface of the second planar support member of the second middle frame that faces the display panel extends toward the first planar support member. Accordingly, the distance between the surface of the first planar support member facing the display panel and the surface of the second planar support member facing the display panel is reduced. Therefore, when the display panel expands, the bending region of the display panel can be effectively supported by the first planar support member and the second planar support member. In this way, the bending region can have better flatness when the display panel expands.

DESCRIPTION OF EMBODIMENTS OF THE DISCLOSURE

To make the objectives, technical schemes, and effects of the present application more clear and specific, the present application is described in further detail below with reference to the embodiments in accompanying with the appending drawings. It should be understood that the specific embodiments described herein are merely for explaining the present application, the term "embodiment" used in the context means an example, instance or illustration, and the present application is not limited thereto.

The present application provides a foldable display device, in which two middle frames provide strong support to a bending region of a display panel. The bending region is avoided from sinking, ensuring that the bending region will not sink or collapse when the foldable display device is in an expanding state, and a better effect is yielded when touch-type APPs are used by users.

Figure 1:
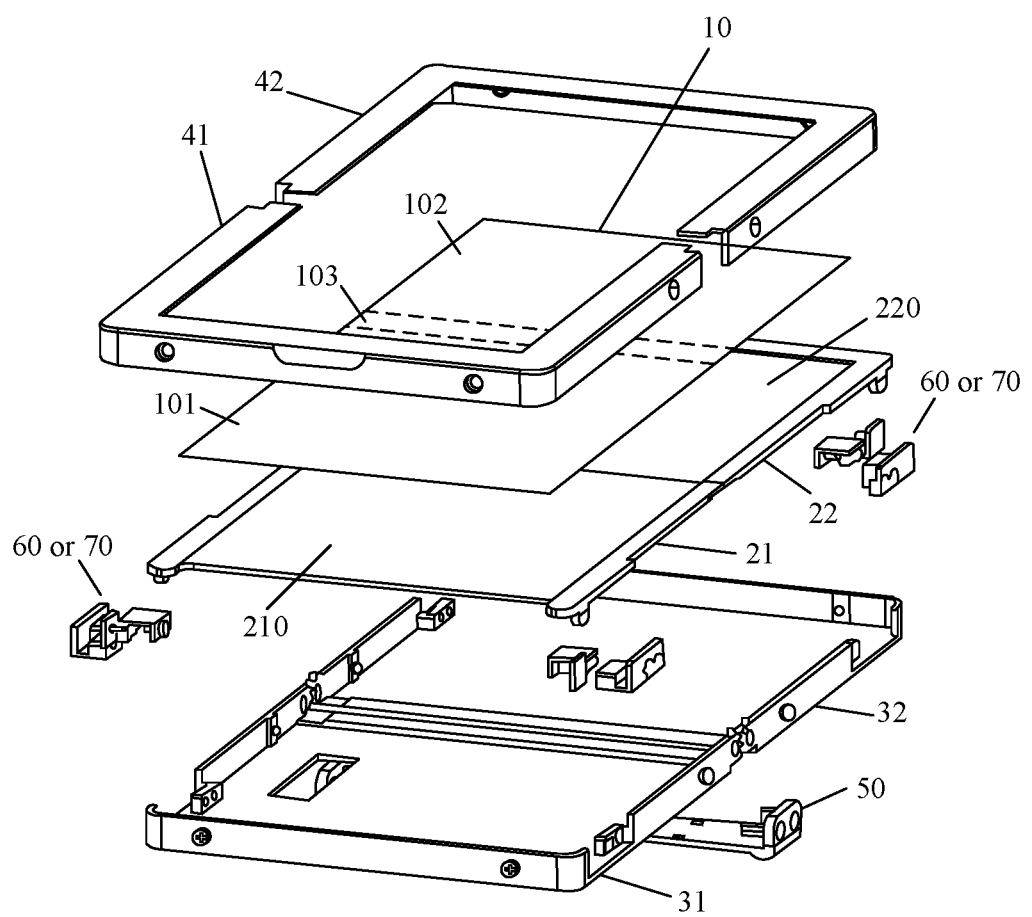
FIG. 1 is an exploded view of a foldable display device according to the present application.

FIG. 1 is an exploded view of a foldable display device according to the present application. As shown in FIG. 1, the foldable display device of the present application includes a display panel 10, a pair of middle frames (i.e., a first middle frame 21 and a second middle frame 22), a pair of bottom frames (i.e., a first bottom frame 31 and a second bottom frame 32), a pair of front frames (i.e., a first front frame 41 and a second front frame 42) and a connecting frame 50. The bottom frames support the middle frames. The front frames cover the middle frames. The display panel is disposed between the middle frames and the front frames. The bottom frames, the middle frames and the front frames are configured to make the foldable display device be in a folding state and an expanding state.

The display panel 10 is a flexible display panel using a flexible substrate (made of a plastic material, for example). The display panel 10 is a flexible organic light emitting diode (OLED) display panel, a flexible liquid crystal display (LCD) panel or a flexible electro-phoretic display (EPD) panel, for example.

The display panel 10 includes a display region having a plurality of pixels and configured to display images. The display region can be divided into a first non-bending region 101, a second non-bending region 102 and a bending region 103. The first non-bending region 101 is located between the bending region 103 and a lateral side of the display panel 10 and the second non-bending region 102 is located between the bending region 103 and another lateral side of the display panel 10. The bending region 103 is located between the first non-bending region 101 and the second non-bending region 102. When the display panel 10 expands, the first non-bending region 101, the second non-bending region 102 and the bending region 103 are planes or are coplanar; when the display panel 10 is folded, the bending region 103 is formed with an arched face or of a curved shape and the first non-bending region 101 and the second non-bending region 102 keep as planes.

The first middle frame 21 is slidably connected to the first bottom frame 31. The second middle frame 22 is slidably connected to the second bottom frame 32. The first middle frame 21 is configured to support the first non-bending region 101 of the display panel 10. The second middle frame 22 is configured to support the second non-bending region 102 of the display panel 10. The first middle frame 21 includes a first planar support member 210. The second middle frame 22 includes a second planar support member 220. The display panel 10 includes a front side and a rear side. The front side is a side at which images are displayed. The rear side is a side opposite to the front side. The first planar support member 210 is adhered to the first non-bending region 101 (specifically, adhered to a region, at the rear side of the display panel 10, corresponding to the first non-bending region 101) and overlaps with the bending region 103 at a side of the bending region 103. The second planar support member 220 is adhered to the second non-bending region 102 (specifically, adhered to a region, at the rear side of the display panel 10, corresponding to the second non-bending region 102) and overlaps with the bending region 103 at the other side of the bending region 103.

The first planar support member 210 and the second planar support member 220 are not adhered to the bending region 103 such that the display panel 10 can be bent at the bending region 103 during the display panel 10 is folded. When the display panel 10 expands, a region of the first planar support member 210 that is not adhered to the bending region 103 can support a side of the bending region 103 and a region of the second planar support member 220 that is not adhered to the bending region 103 can support the other side of the bending region 103.

Figure 2:
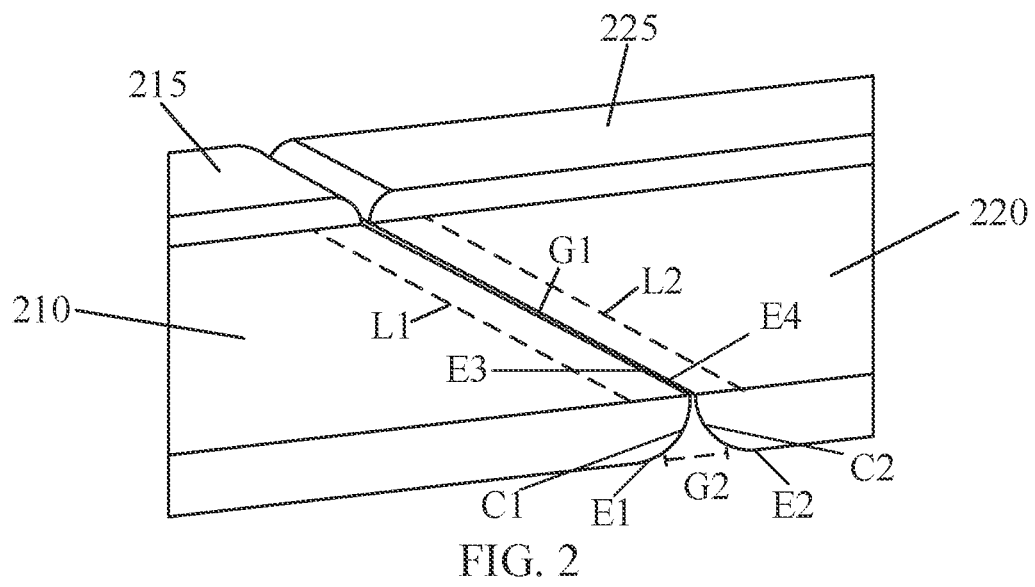
FIG. 2 is a structural diagram showing details of a first middle frame and a second middle frame according to the present application.

FIG. 2 is a structural diagram showing details of a first middle frame and a second middle frame according to the present application. Referring to FIGS. 1 and 2, a first end of the first planar support member 210 combines with the first bottom frame 31, the first end of the first planar support member 210 is located away from the bending region 103, a second end of the first planar support member 210 is closer to the second planar support member 220 than the first end of the first planar support member 210; a first end of the second planar support member 220 combines with the second bottom frame 32, the first end of the second planar support member 220 is located away from the bending region 103, a second end of the second planar support member 220 is closer to the first planar support member 210 than the first end of the second planar support member 220. The first non-bending region 101 and a first face of the first planar support member 210 are located at a same side and the first bottom frame 31 and a second face of the first planar support member 210 are located at a same side; the second non-bending region 102 and a first face of the second planar support member 220 are located at a same side and the second bottom frame 32 and a second face of the second planar support member 220 are located at a same side.

For example, the first middle frame 21 (the second middle frame 22) has a protruding member at the first end thereof. The first bottom frame 31 (the second bottom frame 32) has a slot corresponding to the protruding member. By engaging the protruding member and the slot, the first middle frame 21 (the second middle frame 22) and the first bottom frame 31 (the second bottom frame 32) are combined together.

When the display panel 10 expands, the first face of the first planar support member 210 of the first middle frame 21 and the first face of the second planar support member 220 of the second middle frame 22 are closely joined together and support the bending region 103 of the display panel 10 at the joint. The first face of the first planar support member 210 and the first face of the second planar support member 220 are coplanar. The second face of the first planar support member 210 and the second face of the second planar support member 220 are coplanar. The first face of the first planar support member 210 extends from a position (e.g., a dashed line L1 shown in FIG. 2) corresponding to a lateral side E1 of the second face of the first planar support member 210 at the second end of the first planar support member 210 to the first face of the second planar support member 220; the first face of the second planar support member 220 extends from a position (e.g., a dashed line L2 shown in FIG. 2) corresponding to a lateral side E2 of the second face of the second planar support member 220 at the second end of the second planar support member 220 to the first face of the first planar support member 210. In this way, a first gap G1 between the first face of the first planar support member 210 and the first face of the second planar support member 220 is less than a second gap G2 between the second face of the first planar support member 210 and the second face of the second planar support member 220. The first planar support member 210 and the second planar support member 220 are formed with chamfers, such as chamfers with beveled edges or arcs, at the second ends thereof. Specifically, the first planar support member 210 has a first chamfer C1 which extends from a lateral side E1 of the second face of the first planar support member 210 to a lateral side E3 of the first face of the first planar support member 210 along a direction toward the second planar support member 220. The second planar support member 220 has a second chamfer C2 which extends from a lateral side E2 of the second face of the second planar support member 220 to a lateral side E4 of the first face of the second planar support member 220 along a direction toward the first planar support member 210. When first planar support member 210 and the second planar support member 220 rotate, the deployment of the first chamfer C1 and the second chamfer C2 can avoid the first planar support member 210 and the second planar support member 220 from interfering with the bottom frames (or the connecting frame).

Since the first face of the first planar support member 210 extends toward the second planar support member 220 and the first face of the second planar support member 220 extends toward the first planar support member 210, the gap between the first planar support member 210 and the second planar support member 220 shrinks effectively. The gap is preferred to be less than 0.3 mm. Accordingly, flatness of the bending region 103 is ensured when the display panel 10 expands. In this way, users will not perceive that the bending region 103 sinks apparently when using the display device.

The first bottom frame 31 is configured to support the first planar support member 210 of the first middle frame 21. The second bottom frame 32 is configured to support the second planar support member 210 of the second middle frame 21. When the state of the display panel 10 is changed (e.g., from the expanding state to the folding state, or from the folding state to the expanding state), the first middle frame 21 rotates about a first rotating axis and meanwhile the first bottom frame 31 combined with the first middle frame 21 rotates along therewith; the second middle frame 22 rotates about a second rotating axis and meanwhile the second bottom frame 32 combined with the second middle frame 21 rotates along therewith.

The connecting frame 50 is disposed between the first planar support member 210 of the first middle frame 21 and the second planar support member 220 of the second middle frame 22 (or between the first bottom frame 31 and the second bottom frame 32), and is disposed at a position corresponding to the bending region 103 of the display panel 10. Both of the first bottom frame 31 and the second bottom frame 32 are pivotably connected to the connecting frame 50. When the first bottom frame 31 rotates along with the first middle frame 21 at the first end, the first bottom frame 31 pivots at the second end with respect to the connecting frame 50; when the second bottom frame 32 rotates along with the second middle frame 22 at the first end, the second bottom frame 32 pivots at the second end with respect to the connecting frame 50.

At the first end, the first front frame 41 combines with the first end of the first bottom frame 31. At the second end, the first front frame 41 combines with the second end of the first bottom frame 31. At the first end, the second front frame 42 combines with the first end of the second bottom frame 32. At the second end, the front frame 42 combines with the second end of the second bottom frame 32. The first ends of the first front frame 41 and the second front frame 42 are the ends located away from the bending region 103 of the display panel 10; the second ends of the first front frame 41 and the second front frame 42 are the ends near to the bending region 103 of the display panel 10.

When the first bottom frame 31 and the second bottom frame 32 pivot with respect to the connecting frame 50 to be in a state that they face each other, the display panel 10 is folded at the bending region 103. When the first bottom frame 31 and the second bottom frame 32 pivot with respect to the connecting frame 50 to be in a state that they are coplanar, the display panel 10 expands or becomes a flatten state.

In the present application, the surface of the first planar support member 210 of the first middle frame 21 that faces the display panel 10 extends toward the second planar support member 220 and the surface of the second planar support member 220 of the second middle frame 22 that faces the display panel 10 extends toward the first planar support member 210. Accordingly, the distance between the surface of the first planar support member 210 facing the display panel 10 and the surface of the second planar support member 220 facing the display panel 10 is reduced. Therefore, when the display panel 10 expands, the bending region 103 of the display panel 10 can be effectively supported by the first planar support member 210 and the second planar support member 220. In this way, the bending region 103 can have better flatness when the display panel 10 expands.

In an embodiment, the first middle frame 21 includes a first lateral portion 215 adjacent to the first planar support member 210 and the first lateral portion 215 is disposed at an end of the first planar support member 210 different from the first end and the second ends of the first planar support member 210; the second middle frame 22 includes a second lateral portion 225 adjacent to the second planar support member 220 and the second lateral portion 225 is disposed at an end of the second planar support member 220 different from the first end and the second end of the second planar support member 220. The first lateral portion 215 and the second lateral portion 225 are located at a same side. For example, the first lateral portion 215 and the second lateral portion 225 are located at positions corresponding to a lengthwise edge of the display panel 10.

The first lateral portion 215 and the second lateral portion 225 may correspond to the non-displaying region (e.g., a peripheral wiring region that is not used to display images directly) of the display panel 10 or may correspond to the border or bezel of the display device including the display panel 10. When the display device has a narrow bezel or is borderless, it may have no need to dispose the first lateral portion 215 and the second lateral portion 225.

The surface of the first lateral portion 215 of the first middle frame 21 that faces the display panel 10 is formed with a first curved face along a direction toward the second lateral portion 225 of the second middle frame 22 and the first bottom frame 31; the surface of the second lateral portion 225 of the second middle frame 22 that faces the display panel 10 is formed with a second curved face along a direction toward the first lateral portion 215 of the first middle frame 21 and the second bottom frame 32. The first curved face on the first lateral portion 215 and the second curved face on the second lateral portion 225 are used to prevent the first middle frame 21 and the second middle frame 22 from interfering with each other when the display panel 10 is folded, ensuring smooth of the folding movement.

Further, in the embodiments of the present application, a pre-stress assembly or an electric drive assembly can be utilized to drive the middle frames to move outward during the middle frames rotate, thereby preventing the middle frames from interfering with each other during the folding process, ensuring smooth of the folding movement.

Figure 3:
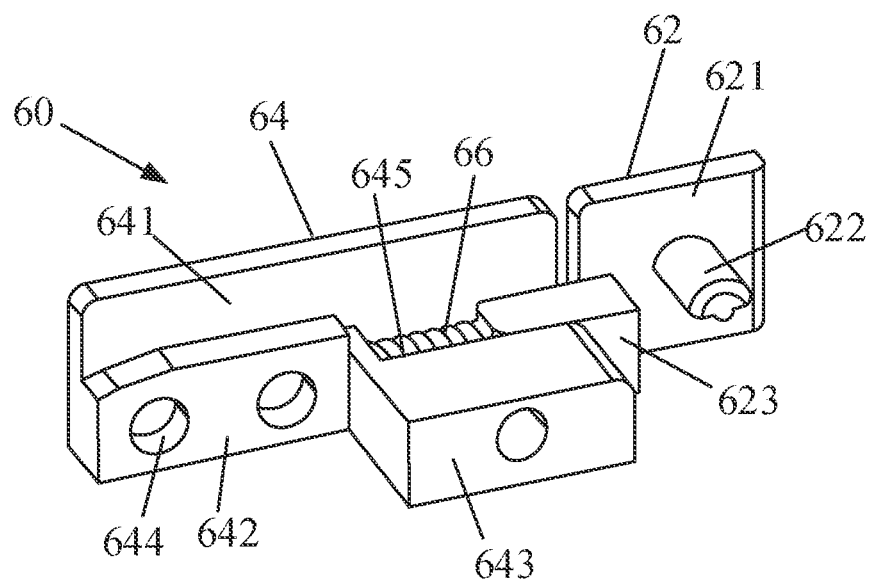
FIG. 3 is a schematic diagram showing a pre-stress assembly according to the present application.

FIG. 3 is a schematic diagram showing a pre-stress assembly according to the present application. In an embodiment, the foldable display device further includes a pre-stress assembly 60. The pre-stress assembly 60 is utilized to provide pre-tension to the middle frames such that the middle frames move slightly outward during their rotation, thereby preventing the middle frames from interfering with each other during the folding process. The number of the pre-stress assembly 60 may correspond to the number of the middle frames. For example, the first middle frame 21 and the second middle frame 22 are provided with corresponding pre-stress assemblies 60, respectively. The following example is illustrated by the pre-stress assembly 60 deployed at the first middle frame 21. As shown in FIG. 3, the pre-stress assembly 60 includes a middle frame connecting member 62, a bottom frame fastening member 64 and an elastic member 66. The middle frame connecting member 62 includes a base 621, a protruded plug 622 fastened to the base 621 and an abutting member 623 fastened to the base 621 and having an abutting face perpendicular to the surface of the base 621. The middle frame connecting member 62 is fastened to and connected to the first middle frame 21 via the protruded plug 622. For example, the first middle frame 21 is provided with a slot (not shown) adaptive to the protruded plug 622. By engagement between the protruded plug 622 and the slot, the middle frame connecting member 62 and the first middle frame 21 are fastened to each other. The abutting face of the abutting member 623 is configured to be against to an end of the elastic member (e.g., a spring) 66. The bottom frame fastening member 64 includes a bottom base 641, a connecting member 642 fastened to the bottom base 641 or integratedly formed with the bottom base 641, and an assembling member 643 configured to accommodate the elastic member 66. The connecting member 642 is provided with a slot 644. The first bottom frame 31 has a protruded plug (not shown) or a screw (not shown) that is adaptive to the slot 644. By engagement between the slot 644 and the protruded plug (or the screw), the bottom frame fastening member 64 and the first bottom frame 31 are fastened to each other. The assembling member 643 is fastened to the bottom base 641 and is formed with a receiving slot 645. The elastic member 66 is placed in the receiving slot 645. The elastic member 66 abuts on a wall of the receiving slot 645 at the other end thereof. The elastic member 66 is preset with an unbalanced elastic force. For example, the elastic member 66 is a spring and the spring is pressed in advance. The wall of the receiving slot 645 of the assembling member 643 of the bottom frame fastening member 64 and the abutting face of the abutting member 623 of the middle frame connecting member 62 are provided with the elastic force at two ends of the elastic member 66, respectively. Accordingly, the middle frame connecting member 62 and the bottom frame fastening member 64 can be provided with the pre-tension that makes them move away from each other. Therefore, when the first middle frame 21 rotates, the elastic member 66 can push the first middle frame 21 to make the first middle frame 21 move slightly outward, preventing the first middle frame 21 from interfering with the second middle frame 22 during the folding process.

Figure 4:
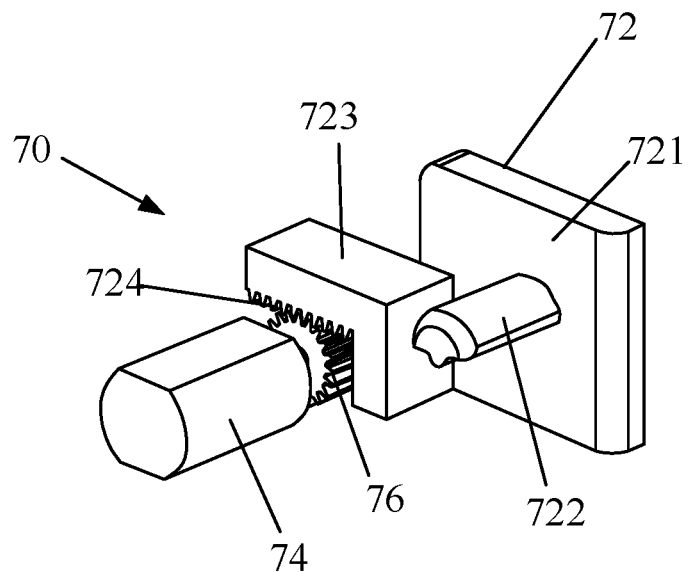
FIG. 4 is a schematic diagram showing an electric drive assembly according to the present application.

FIG. 4 is a schematic diagram showing an electric drive assembly according to the present application. In an embodiment, the foldable display device further includes an electric drive assembly 70. The electric drive assembly 70 is utilized to make the middle frames move slightly outward during their rotation, thereby preventing the middle frames from interfering with each other during the folding process. The number of the electric drive assemblies 70 may correspond to the number of the middle frames. For example, the first middle frame 21 and the second middle frame 22 are provided with corresponding electric drive assemblies 70, respectively. The following example is illustrated by the electric drive assembly 70 deployed at the first middle frame 21. As shown in FIG. 4, the electric drive assembly 70 includes a middle frame connecting member 72, a motor 74 and a gear wheel 76 disposed along a rotating axis of the motor 74. The middle frame connecting member 72 includes a base 721, a protruded plug 722 fastened to the base 721 and an intervening member 723 fastened to the base 721. For example, the intervening member 723 is fastened to the base 721 by adhering them together or is integratedly formed with the base 721. The middle frame connecting member 72 is fastened to and connected to the first middle frame 21 via the protruded plug 722. For example, the first middle frame 21 is provided with a slot (not shown) adaptive to the protruded plug 722. By engagement between the protruded plug 722 and the slot, the middle frame connecting member 72 and the first middle frame 21 are fastened to each other. The motor 74 can be disposed on a frame (e.g., a back case) of the foldable display device. The intervening member 723 of the middle frame connecting member 72 is provided with rack 724. The gear wheel 76 on the motor 74 engages with the rack 724 of the intervening member 723 of the middle frame connecting member 72. By cooperation of the gear wheel 76 and the rack 724, the power of the motor 74 passes to the first middle frame 21. The motor 74 is operated when the first middle frame 21 rotates. A pushing force generated by the motor 74 and applied to the first middle frame 21 makes the first middle frame 21 move slightly outward during the first middle frame 21 rotates, preventing the first middle frame 21 from interfering with the second middle frame 22 during the folding process.

Figure 5:
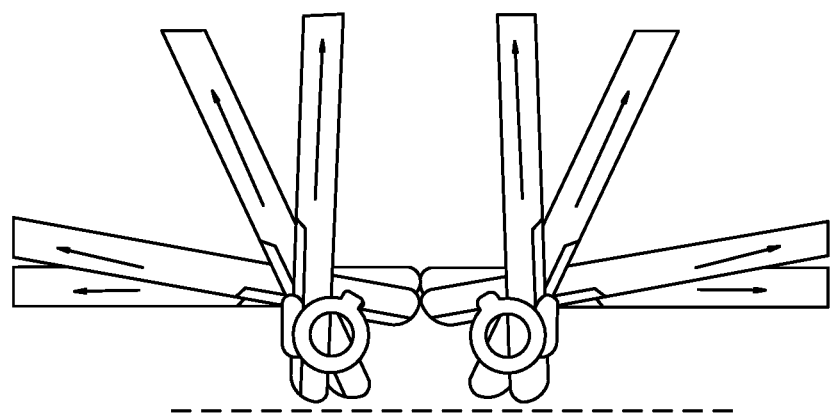
FIG. 5 is a diagram illustrating simulation of movement of middle frames according to the present application.

FIG. 5 is a diagram illustrating simulation of movement of middle frames according to the present application. As shown in FIG. 5, when the middle frames rotate about a rotating axis, the middle frames move outward during their rotation. This avoids the interference caused during their rotation and thus the folding can be accomplished smoothly.

While the preferred embodiments of the present application have been illustrated and described in detail, various modifications and alterations can be made by persons skilled in this art. The embodiment of the present application is therefore described in an illustrative but not restrictive sense. It is intended that the present application should not be limited to the particular forms as illustrated, and that all modifications and alterations which maintain the realm of the present application are within the scope as defined in the appended claims.

The invention claimed is:

1. A foldable display device, comprising a bottom frame, a middle frame and a front frame that are configured to make the display device be in a folding state and an expanding state, the bottom frame configured to support the middle frame, the front frame configured to cover the middle frame, the display device comprising:
a display panel, disposed between the middle frame and the front frame, the display panel comprising a display region having a plurality of pixels and configured to display images, the display region divided into a first non-bending region, a second non-bending region and a bending region, the bending region located between the first non-bending region and the second non-bending region;
wherein the middle frame comprises:
a first middle frame, slidably connected to the bottom frame, comprising a first planar support member which is adhered to the first non-bending region and overlaps with the bending region at a side of the bending region; and
a second middle frame, slidably connected to the bottom frame, comprising a second planar support member which is adhered to the second non-bending region and overlaps with the bending region at the other side of the bending region, the display panel and a first face of the first planar support member located at a same side, the bottom frame and a second face of the first planar support member located at a same side, the display panel and a first face of the second planar support member located at a same side, the bottom frame and a second face of the second planar support member located as a same side,
wherein a first end of the first planar support member is located away from the bending region, a second end of the first planar support member is closer to the second planar support member than the first end of the first planar support member, a first end of the second planar support member is located away from the bending region, a second end of the second planar support member is closer to the first planar support member than the first end of the second planar support member, wherein the first face of the first planar support member extends from a position corresponding to a lateral side of the second face of the first planar support member at the second end of the first planar support member to the first face of the second planar support member; the first face of the second planar support member extends from a position corresponding to a lateral side of the second face of the second planar support member at the second end of the second planar support member to the first face of the first planar support member,
wherein a first gap between the first face of the first planar support member and the first face of the second planar support member is less than a second gap between the second face of the first planar support member and the second face of the second planar support member.

2. The foldable display device according to claim 1, wherein when the display panel expands, the first face of the first planar support member and the first face of the second planar support member are coplanar and the second face of the first planar support member and the second face of the second planar support member are coplanar.

3. The foldable display device according to claim 1, wherein the first gap is less than or equal to 0.3 mm.

4. The foldable display device according to claim 1, wherein the first planar support member has a first chamfer which extends from a lateral side of the second face of the first planar support member to a lateral side of the first face of the first planar support member along a direction toward the second planar support member; the second planar support member has a second chamfer which extends from a lateral side of the second face of the second planar support member to a lateral side of the first face of the second planar support member along a direction toward the first planar support member.

5. The foldable display device according to claim 1, wherein the first middle frame comprises a first lateral portion adjacent to the first planar support member, the first lateral portion is disposed at an end of the first planar support member different from the first end and the second end of the first planar support member; the second middle frame comprises a second lateral portion adjacent to the second planar support member, the second lateral portion is disposed at an end of the second planar support member different from the first end and the second end of the second planar support member, the first lateral portion and the second lateral portion are located at a same side, wherein a surface of the first lateral portion of the first middle frame that faces the display panel is formed with a first curved face along a direction toward the second lateral portion and the bottom frame; a surface of the second lateral portion of the second middle frame that faces the display panel is formed with a second curved face along a direction toward the first lateral portion and the bottom frame.

6. The foldable display device according to claim 1, further comprising a pre-stress assembly, which comprises:
a middle frame connecting member, connected to the middle frame, comprising an abutting member having an abutting face;
a bottom frame fastening member, fastened to the bottom frame, comprising an assembling member formed with a receiving slot; and
an elastic member, disposed in the receiving slot of the assembling member of the bottom frame fastening member, the elastic member preset with an unbalanced elastic force, a wall of the receiving slot of the assembling member of the bottom frame fastening member and the abutting face of the abutting member of the middle frame connecting member provided with the elastic force at two ends of the elastic member, respectively, wherein when the middle frame rotates, the elastic member pushes the middle frame to make the middle frame move outward.

7. The foldable display device according to claim 1, further comprising an electric drive assembly, which comprises:
a middle frame connecting member, connected to the middle frame, comprising a base and an intervening member fastened to the base, the intervening member having rack;
a motor; and
a gear wheel, disposed along a rotating axis of the motor, the gear wheel on the motor engaging with the rack of the intervening member of the middle frame connecting member, wherein the motor is operated when the middle frame rotates, to generate a pushing force applied to the middle frame such that the middle frame moves outward.

8. The foldable display device according to claim 1, further comprising:
a connecting frame, disposed at a position corresponding to the bending region of the display panel, the connecting frame pivotably connected to the bottom frame.

9. A foldable display device, comprising a bottom frame, a middle frame and a front frame that are configured to make the display device be in a folding state and an expanding state, the bottom frame configured to support the middle frame, the front frame configured to cover the middle frame, the display device comprising:
a display panel, disposed between the middle frame and the front frame, the display panel comprising a display region having a plurality of pixels and configured to display images, the display region divided into a first non-bending region, a second non-bending region and a bending region, the bending region located between the first non-bending region and the second non-bending region;
wherein the middle frame comprises:
a first middle frame, slidably connected to the bottom frame, comprising a first planar support member which is adhered to the first non-bending region and overlaps with the bending region at a side of the bending region; and
a second middle frame, slidably connected to the bottom frame, comprising a second planar support member which is adhered to the second non-bending region and overlaps with the bending region at the other side of the bending region, the display panel and a first face of the first planar support member located at a same side, the bottom frame and a second face of the first planar support member located at a same side, the display panel and a first face of the second planar support member located at a same side, the bottom frame and a second face of the second planar support member located as a same side,
wherein the first face of the first planar support member of the first middle frame and the first face of the second planar support member of the second middle frame are closely joined together and support the bending region of the display panel at the joint,
wherein a first gap between the first face of the first planar support member and the first face of the second planar support member is less than a second gap between the second face of the first planar support member and the second face of the second planar support member.

10. The foldable display device according to claim 9, wherein a first end of the first planar support member is located away from the bending region, a second end of the first planar support member is closer to the second planar support member than the first end of the first planar support member, a first end of the second planar support member is located away from the bending region, a second end of the second planar support member is closer to the first planar support member than the first end of the second planar support member, wherein the first face of the first planar support member extends from a position corresponding to a lateral side of the second face of the first planar support member at the second end of the first planar support member to the first face of the second planar support member; the first face of the second planar support member extends from a position corresponding to a lateral side of the second face of the second planar support member at the second end of the second planar support member to the first face of the first planar support member.

11. The foldable display device according to claim 9, wherein when the display panel expands, the first face of the first planar support member and the first face of the second planar support member are coplanar and the second face of the first planar support member and the second face of the second planar support member are coplanar.

12. The foldable display device according to claim 9, wherein the first gap is less than or equal to 0.3 mm.

13. The foldable display device according to claim 9, wherein the first planar support member has a first chamfer which extends from a lateral side of the second face of the first planar support member to a lateral side of the first face of the first planar support member along a direction toward the second planar support member; the second planar support member has a second chamfer which extends from a lateral side of the second face of the second planar support member to a lateral side of the first face of the second planar support member along a direction toward the first planar support member.

14. The foldable display device according to claim 10, wherein the first middle frame comprises a first lateral portion adjacent to the first planar support member, the first lateral portion is disposed at an end of the first planar support member different from the first end and the second end of the first planar support member; the second middle frame comprises a second lateral portion adjacent to the second planar support member, the second lateral portion is disposed at an end of the second planar support member different from the first end and the second end of the second planar support member, the first lateral portion and the second lateral portion are located at a same side, wherein a surface of the first lateral portion of the first middle frame that faces the display panel is formed with a first curved face along a direction toward the second lateral portion and the bottom frame; a surface of the second lateral portion of the second middle frame that faces the display panel is formed with a second curved face along a direction toward the first lateral portion and the bottom frame.

15. The foldable display device according to claim 9, further comprising a pre-stress assembly, which comprises:

a middle frame connecting member, connected to the middle frame, comprising an abutting member having an abutting face;

a bottom frame fastening member, fastened to the bottom frame, comprising an assembling member formed with a receiving slot; and an elastic member, disposed in the receiving slot of the assembling member of the bottom frame fastening member, the elastic member preset with an unbalanced elastic force, a wall of the receiving slot of the assembling member of the bottom frame fastening member and the abutting face of the abutting member of the middle frame connecting member provided with the elastic force at two ends of the elastic member, respectively, wherein when the middle frame rotates, the elastic member pushes the middle frame to make the middle frame move outward.

16. The foldable display device according to claim 9, further comprising an electric drive assembly, which comprises:

a middle frame connecting member, connected to the middle frame, comprising a base and an intervening member fastened to the base, the intervening member having rack;

a motor; and a gear wheel, disposed along a rotating axis of the motor, the gear wheel on the motor engaging with the rack of the intervening member of the middle frame connecting member, wherein the motor is operated when the middle frame rotates, to generate a pushing force applied to the middle frame such that the middle frame moves outward.

17. The foldable display device according to claim 9, further comprising:

a connecting frame, disposed at a position corresponding to the bending region of the display panel, the connecting frame pivotably connected to the bottom frame.

* * * * *